(12) United States Patent
Williams et al.

(10) Patent No.: US 8,980,523 B2
(45) Date of Patent: Mar. 17, 2015

(54) IMAGING PARTICULATES, PAPER AND PROCESS, AND IMAGING OF PAPER USING DUAL WAVELENGTH LIGHT

(71) Applicant: International Paper Company, Memphis, TN (US)

(72) Inventors: Richard C. Williams, Loveland, OH (US); Richard D. Faber, Memphis, TN (US); Oleg Grinevick, Holland, OH (US); John Malpert, Maumee, OH (US); Alexandre Mejiritski, Bowling Green, OH (US); Douglas C. Neckers, Perrysburg, OH (US)

(73) Assignee: International Paper Company, Memphis, TN (US)

( * ) Notice: Subject to any disclaimer, the term of this patent is extended or adjusted under 35 U.S.C. 154(b) by 0 days.

(21) Appl. No.: 14/082,461

(22) Filed: Nov. 18, 2013

(65) Prior Publication Data

US 2014/0080044 A1 Mar. 20, 2014

Related U.S. Application Data

(63) Continuation of application No. 13/086,041, filed on Apr. 13, 2011, now Pat. No. 8,586,279, which is a continuation of application No. PCT/US2009/060327, filed on Oct. 12, 2009.

(60) Provisional application No. 61/196,128, filed on Oct. 15, 2008.

(51) Int. Cl.
*G03C 1/72* (2006.01)
*G03F 7/004* (2006.01)

(52) U.S. Cl.
USPC .......................................... 430/138; 430/270.1

(58) Field of Classification Search
USPC ................................................ 430/138, 270.1
See application file for complete search history.

(56) References Cited

U.S. PATENT DOCUMENTS

| 3,042,515 A | 7/1962 | Wainer |
| 3,282,693 A | 11/1966 | Sagura et al. |
| 3,390,994 A | 7/1968 | Cescon |

(Continued)

FOREIGN PATENT DOCUMENTS

| CN | 1875424 | 12/2006 |
| DE | 4109239 | 9/1992 |

(Continued)

OTHER PUBLICATIONS

G. A. Smook, Handbook for Pulp and Paper Technologiest, 2nd edition, 1992 p. 2-8, p. 225, p. 285, p. 286-88, p. 283-86.

*Primary Examiner* — Amanda C. Walke
(74) *Attorney, Agent, or Firm* — Thomas W. Barnes, III

(57) ABSTRACT

The present invention provides dual wavelength imaging compositions, processes for forming dual wavelength imaging compositions, methods for forming images using dual wavelength imaging compositions and substrate (e.g., paper web) treated (e.g., coated) on one or both sides with dual wavelength imaging compositions. Also provided is a dual wavelength imaging particulate comprising a matrix of polymer material and containing: one or more image-forming agents; a photo-oxidizing agent which is activated at a first wavelength of light to cause the one or more image-forming agents to form one or more images; and a reducing agent which is activated at a second wavelength of light to cause termination of the formation of the one or more images.

15 Claims, 2 Drawing Sheets

(56) References Cited

U.S. PATENT DOCUMENTS

| | | | |
|---|---|---|---|
| 3,445,234 A | 5/1969 | Cescon et al. | |
| 3,479,185 A | 11/1969 | Chambers, Jr. | |
| 3,615,568 A | 10/1971 | Jenkins | |
| 3,658,543 A | 4/1972 | Gerlach, Jr. et al. | |
| 4,247,618 A | 1/1981 | Dessauer et al. | |
| 4,252,887 A | 2/1981 | Dessauer | |
| 4,311,783 A | 1/1982 | Dessauer | |
| 4,879,201 A | 11/1989 | Hasegawa | |
| 4,962,009 A | 10/1990 | Washizu et al. | |
| 4,973,542 A | 11/1990 | Takenouchi et al. | |
| 5,157,012 A | 10/1992 | Mathiaparanam et al. | |
| 5,389,489 A | 2/1995 | Yanagihara et al. | |
| 5,411,215 A * | 5/1995 | Rouse | 241/21 |
| 5,595,853 A | 1/1997 | Ono et al. | |
| 5,631,296 A | 5/1997 | Birrenbach et al. | |
| 5,789,135 A | 8/1998 | Katoh et al. | |
| 6,362,269 B1 * | 3/2002 | Ishihata et al. | 524/449 |
| 7,144,676 B2 | 12/2006 | Barr et al. | |
| 7,223,519 B2 | 5/2007 | Barr et al. | |
| 7,514,198 B2 | 4/2009 | Kasperchik et al. | |
| 2003/0093157 A1 * | 5/2003 | Casares et al. | 623/23.73 |
| 2004/0033449 A1 | 2/2004 | Inoue | |
| 2005/0053860 A1 | 3/2005 | Gore | |
| 2006/0060317 A1 | 3/2006 | Roding et al. | |
| 2006/0228514 A1 | 10/2006 | Gore | |
| 2007/0087293 A1 | 4/2007 | Day | |
| 2007/0092827 A1 | 4/2007 | Gore | |
| 2007/0281244 A9 | 12/2007 | Kasperchik et al. | |
| 2010/0268384 A1 | 10/2010 | Jones et al. | |
| 2012/0003592 A1 | 1/2012 | Williams et al. | |
| 2014/0080057 A1 | 3/2014 | Williams et al. | |

FOREIGN PATENT DOCUMENTS

| | | |
|---|---|---|
| EP | 2003501 | 5/2008 |
| EP | 2003496 | 12/2008 |
| JP | 6239738 | 6/1994 |
| WO | 2005027130 | 3/2005 |
| WO | 2007047932 | 4/2007 |
| WO | 2010045137 | 4/2010 |
| WO | 2010045140 | 4/2010 |

* cited by examiner

IMAGING PARTICULATES, PAPER AND PROCESS, AND IMAGING OF PAPER USING DUAL WAVELENGTH LIGHT

STATEMENT OF JOINT RESEARCH AGREEMENT

In compliance with 37 C.F.R. §1.71(g) (1), disclosure is herein made that the claimed invention is made pursuant to a Joint Research Agreement as defined in 35 U.S.C. 103 (c) (3), that is in effect on or before the date the claimed invention is made, and as a result of activities undertaken within the scope of the Joint Research Agreement, by or on the behalf of the International Paper Company and Spectra Group Ltd.

BACKGROUND

1. Field of the Invention

The present invention broadly relates to a composition comprising dual wavelength image-forming particulates which may be used with a substrate. The present invention also broadly relates to a process for preparing these dual wavelength image-forming particulates. The present invention additionally broadly relates to substrates treated on one or both sides with this dual wavelength imaging particulate-containing composition. The present invention further broadly relates a process for treating one or more sides of a substrate with these dual wavelength image-forming particulates. The present invention further broadly relates to a method for imaging of a substrate using these dual wavelength image-forming particulates.

2. Related Art

Electrophotography provides a non-impact printing technology for today's reprographic industries. A representative electrophotographic printing or copying process normally creates images on a coated polymeric substrate in five steps. These steps include: (1) depositing a uniform electric charge onto a photoconductor drum; (2) creating an electrostatic latent image on the photoconductor by exposing the photoconductor to an oscillating narrow laser beam that is turned on and off digitally or a stationary array of LED lights which are turned on and off digitally; (3) exposing the photoconductor to toner particles such that toner particles having the correct polarity adhere to the exposed latent image; (4) passing the medium to be printed between the photoconductor and a transfer corona to cause the toner particles to transfer from the photoconductor to the medium; and (5) fixing (e.g., fusing) the transferred toner particles on the medium.

For example, a form of electrophotographic printing is laser printing. In laser printing, there are essentially five steps. In the first step (charging), a primary charge roller projects an electrostatic charge onto the photoreceptor, a revolving photosensitive drum or belt, which is capable of holding an electrostatic charge on its surface as long as it hasn't been exposed to certain wavelengths of electromagnetic radiation. In the second step (writing), a raster image processor (RIP) chip converts incoming images to a raster image suitable for scanning onto the photoreceptor. A laser (or laser diode) is aimed at a moving mirror, which directs the laser beam through a system of lenses and mirrors onto the photoreceptor wherever the laser strikes the photoreceptor the charge is reversed, thus creating a latent electrophotographic image on the photoreceptor surface. In the third step (developing), the surface containing the latent image is exposed to toner, with the charged toner particles being electrostatically attracted to the photoreceptor where the laser wrote the latent image. In the fourth step (transferring), the photoreceptor is pressed or rolled over paper, thus transferring the image formed by the charged toner particles. In the fifth step (fusing), the paper with the transferred image passes through a fuser assembly having rollers that provide heat and pressure to bond or fuse the toner particles of the formed image to the paper.

Instead of electrophotographic printing such as laser printing, ink jet printers may be used. There are essentially three types of ink jet printers. The first category, thermal ink jet or bubble jet printers, work by having a print cartridge with a series of tiny electrically heated chambers constructed by photolithography. To produce an image, the printer runs a pulse of current through heating elements, causing steam in a chamber to form a bubble, which then propels a droplet of ink (usually water-based, pigment-based or dye-based) onto the paper. The ink's surface tension pulls another charge of ink into the chamber through a narrow channel attached to an ink reservoir.

A second category, piezoelectric ink jet printers, uses a piezoelectric material in an ink-filled chamber behind each nozzle instead of a heating element. When a voltage is applied, the crystal changes shape or size, which generates a pressure pulse in the fluid, thus forcing a droplet of ink from the nozzle. This is essentially the same mechanism as in the thermal inkjet printer but generates the pressure pulse using a different physical principle.

A third category, continuous ink jet printers, uses a high-pressure pump that directs liquid ink from a reservoir through a microscopic nozzle, thus creating a continuous stream of ink droplets. A piezoelectric crystal causes the stream of liquid to break into droplets at regular intervals, which are then subjected to an electrostatic field created by a charging electrode as they form. The field is varied according to the degree of drop deflection desired, thus resulting in a controlled, variable electrostatic charge on each droplet. The charged droplets are then directed (deflected) to the receptor material to be printed by electrostatic deflection plates, or are allowed to continue on undeflected to a collection gutter for reuse.

Technological advances in electrophotography and ink jet printers have brought an increase in the popularity of color electrophotographic printers and copiers, as well as color ink jet printer. Unlike a monochrome printer or copier wherein only a single toner or ink jet cartridge, i.e. black toner or ink jet cartridge, is employed, full color printing or copying may require as many as four toner or ink droplet cartridges which provide yellow, magenta, cyan, and black. Because a separate imaging process may be required for each of the four toner or ink printer cartridges, color printers and copiers may be much slower and more expensive than their monochrome counterparts. The recording media suitable for color printers and copiers may also need to meet more stringent requirements to provide a true full-color reproduction of the original.

Copying and printing using electrophotographic or ink jet processes does have some disadvantages, especially in terms of the toners and inks used to impart the resulting images. In electrographic copying or printing, the toner particles may not fuse properly, thus creating a messy product that can get on hands, clothes, etc. Depending on how much of the paper comprises the image, there may be some portion of the toner particles that are not adhered to the paper, but are instead collected as a residue that eventually may need to be disposed of. In ink jet printing, there are the conflicting requirements for a coloring agent that will stay on the surface, yet provide rapid dispersement of the carrier. Most ink jet printer cartridges use aqueous inks (e.g., based on a mixture of water, glycol and some dyes or pigments) that may be difficult to control on the surface of print media and therefore require may require specially coated media.

Accordingly, it would be desirable to develop a method of forming an image on a paper web or other substrate that provides for the high speed and high quality printed images without the deficiencies of ink jet and electrophotographic methods of printing.

SUMMARY

According to a first broad aspect of the present invention, there is provided an article comprising: a dual wavelength image-forming particulate comprising a matrix of polymer material and containing: one or more image-forming agents; a photo-oxidizing agent which is activated at a first wavelength of light to cause the one or more image-forming agents to form one or more images; and a reducing agent which is activated at a second wavelength of light to cause termination of the formation of the one or more images.

According to a second broad aspect of the present invention, there is provided an imaging composition comprising:
 a solvent; and
 a plurality of dual wavelength image-forming particulates present in the solvent, wherein each particulate comprises a matrix of polymer material and contains:
 one or more imaging agents; and
 a photo-oxidizing agent which is activated at a first wavelength of light to cause the one or more image-forming agents to form one or more images; and
 a reducing agent which is activated at a second wavelength of light to cause termination of the formation of the one or more images.

According to a third broad aspect of the present invention, there is provided an article comprising:
 a substrate having first and second surfaces; and
 a plurality of image-forming particulates applied to at least one of the first and second surfaces, each particulate comprising a matrix of polymer material and containing:
 one or more imaging agents; and
 a photo-oxidizing agent which is activated at a first wavelength of light to cause the one or more image-forming agents to form one or more images in or on the substrate; and
 a reducing agent which is activated at a second wavelength of light to cause termination of the formation of the one or more images.

According to a fourth broad aspect of the present invention, there is provided a process comprising the following steps of:
 (a) providing a substrate having first and second surfaces; and
 (b) providing a plurality of dual wavelength imaging particulates, wherein the particulates each comprise a matrix of polymer material and contain:
 one or more imaging agents;
 a photo-oxidizing agent which is activated at a first wavelength of light to cause the one or more image-forming agents to form one or more images; and
 a reducing agent which is activated at a second wavelength of light to cause termination of the formation of the one or more images;
 (c) treating at least one of the first and second surfaces of the substrate of step (a) with the particulates of step (b).

According to a fifth broad aspect of the present invention, there is provided a method comprising the following steps of:
 (a) providing a dual wavelength imaging substrate comprising:
 a substrate having a first surface and a second surface; and
 a plurality of dual wavelength image-forming particulates applied to at least one of the first and second surfaces, wherein the particulates each comprise a matrix of polymer material and contain:
 one or more imaging agents;
 a photo-oxidizing agent which is activated at a first wavelength of light to cause the one or more image-forming agents to form one or more images; and
 a reducing agent which is activated at a second wavelength of light to cause termination of the formation of the one or more images;
 (b) subjecting the dual wavelength imaging substrate of step (a) to the first wave length of light that activates the photo-oxidizing agent to cause the one or more imaging agents to form one or more images in or on the substrate; and
 (c) subjecting the imaged substrate of step (b) to the second wave length of light that activates the reducing agent to cause the termination of the formation of the one or more images.

According to a sixth broad aspect of the invention, there is provided a process for making a dual wavelength imaging composition comprising the following steps:
 (a) providing a solvent; and
 (b) dispersing or suspending a plurality of dual wavelength image-forming particulates in the solvent to form a dual wavelength imaging composition, wherein each particulate comprises a matrix of polymer material and contains:
 one or more image-forming agents; a photo-oxidizing agent which is activated at a first wavelength of light to cause the one or more image-forming agents to form one or more images; and
 a reducing agent which is activated at a second wavelength of light to cause termination of the formation of the one or more images.

BRIEF DESCRIPTION OF THE DRAWINGS

The invention will be described in conjunction with the accompanying drawings, in which.

DETAILED DESCRIPTION

Figure 1:
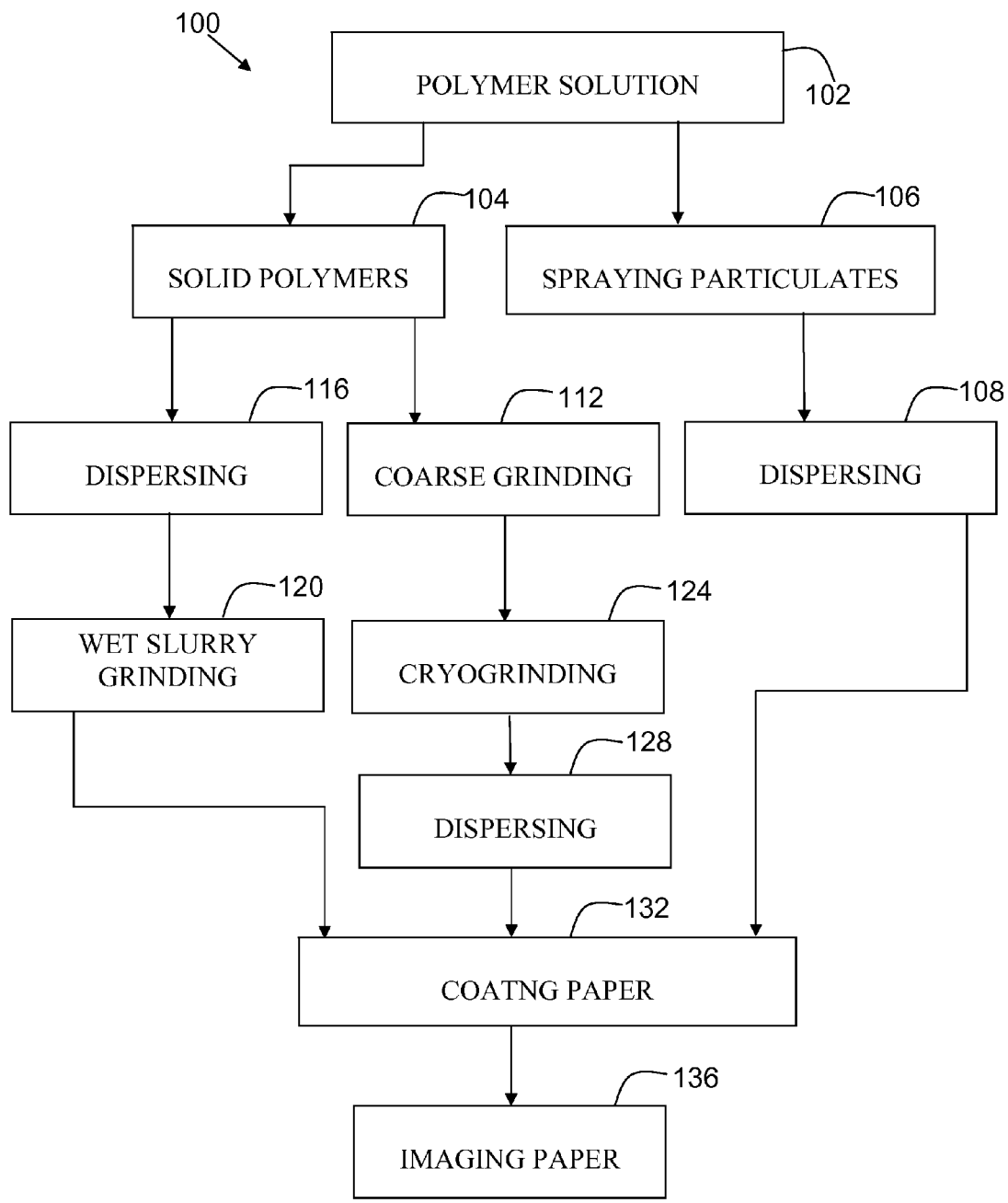
FIG. 1 is a schematic flowchart illustrating general embodiments of a process for preparing a dual wavelength imaging composition, for coating a paper web with the dual wavelength imaging composition according to embodiments of the present invention, and for imaging of the coated paper.

It is advantageous to define several terms before describing the invention. It should be appreciated that the following definitions are used throughout this application.

DEFINITIONS

Where the definition of terms departs from the commonly used meaning of the term, applicant intends to utilize the definitions provides below, unless specifically indicated.

For the purposes of the present invention, the term "substrate" refers to any material which may be treated with image-forming particulates or compositions comprising same to provide articles which may form images when exposed to light which activates the photo-oxidizing agent. Substrates may include webs, sheets, strips, etc., may be in the form of a continuous roll, a discrete sheet, etc., and may comprise various materials or combinations of materials, including, for example, plastics (polymers), paper webs, nonwovens, etc.

For the purposes of the present invention, the term "paper web" refers to a fibrous web that may be formed, created, produced, etc., from a mixture, furnish, etc., from paper fibers, plus any other optional papermaking additives such as, for example, fillers, wet-strength agents, optical brightening agents (or fluorescent whitening agent), etc. Paper webs may include an uncoated paper web, coated paper web, etc. The paper web may be in the form of a continuous roll, a discrete sheet, etc.

For the purposes of the present invention, the term "paper fibers" refers to plant fibers derived from, for example, woody and nonwoody fibers, and which may comprise cellulose, cellulose derivatives, etc. See also G. A. Smook, Handbook for Pulp and Paper Technologists ($2^{nd}$ Edition, 1992), pages 2-8, the entire contents and disclosure of which is herein incorporated by reference, for a general description of paper fibers and sources thereof.

For the purposes of the present invention, the term "treated substrate" refers to a substrate, (e.g., paper web) which has a sufficient loading (e.g., a coat weight of at least about 50 lbs/ton, for example, at least about 100 lbs/ton) of dual wavelength image-forming particulates present on one or both sides or surfaces of the substrate (e.g., paper web) such that one or more images may be formed from the particulates. In one embodiment, the loading of dual wavelength image-forming particulates may be present in an amount of up to about 500 lbs/ton (e.g., up to about 200 lbs/ton) on one or both sides or surfaces of the substrate (e.g., paper web).

For the purposes of the present invention, the term "untreated substrate" refers to a paper web which has a 0 or substantially 0 loading of dual wavelength image-forming particulates present on one or both sides or surfaces of the substrate.

For the purposes of the present invention, the term "single-side treated substrate" refers to a substrate (e.g., paper web) which has dual wavelength image-forming particulates present on one, but not both, sides or surfaces of the substrate.

For the purposes of the present invention, the term "double-side coated treated substrate" refers to a substrate (e.g., paper web) which has dual wavelength image-forming particulates present on both sides or surfaces of the substrate.

For the purposes of the present invention, the term "calendered paper" refers to a paper web which has been subjected to calendering to, for example, smooth out the paper for enabling image formation on the paper, and to increase the gloss on the paper surface. For example, calendering may involve a process of using pressure for embossing a smooth surface on the still rough paper surface. Calendering of paper may be carried out on a calendar which may comprise a series of rolls at the end of a papermaking machine (on-line), or separate from the papermaking machine (off-line).

For the purposes of the present invention, the term "particulate" refers to a relatively tiny or small solid particle which may be spherical-shaped, oval-shaped, etc., which may be regular and/or irregular in shape, and which may range in size from less than about 10 nm. to more than 100 microns in diameter and which comprises a matrix of polymer material, and optionally other components, for example, plasticizers, softening agents, tackifying agents, texturing agents, dispersing aids, etc., and which contains, encapsulates, has embedded or dispersed therein, etc., one or more image-forming agents, a photo-oxidizing agent, a reducing agent, acids/coupler, electron donor agents, etc.

For the purposes of the present invention, the term "image-forming particulate" refers to those particulates which comprise or are comprised of a matrix of polymer material and which contain at least one or more imaging agents, a photo-oxidizing agent, and a reducing agent, but which may contain other agents, for example, acids/couplers, electron donating agents, etc. When subjected to a first wavelength of light, the photo-oxidizing agent is activated to cause the imaging agent(s) form, create, etc., the one or more images; when subjected to a second wavelength of light, the reducing agent is activated to terminate formation, creation, etc., of the one or more images.

For the purposes of the present invention, the term "dual wavelength imaging composition" refers to those compositions which comprise a plurality of image-forming particulates, which may additionally comprise solvents, dispersing agents, suspending agents, etc., and which may form, create, etc., one or more images. These dual wavelength imaging compositions may impart other properties to a substrate (e.g., paper web) besides forming, creating, etc., one or more images, for example, paper sizing properties, opacity, brightening, etc. For these other properties, these dual wavelength imaging compositions may include other optional paper additives, for example, paper starch binders, pigments, paper co-binders, optical brightening agents (or fluorescent whitening agents), cationic dye fixing agents, anti-static agents, anti-scratch and mar resistance agents, bulking agents, etc. The imaging composition may be formulated as a solution, suspension, dispersion, emulsion, etc., and may wholly or partly comprise water, e.g., an aqueous solution, suspension, dispersion, emulsion, etc.

For the purposes of the present invention, the term "polymer material" refers to one or more polymers that are used to form the particulate of the image-forming particulate, and which may be optionally included in the dual light imaging composition to thicken the formulation, to adhere the formulation to the substrate (e.g., paper web), to be used, for example, in conjunction with a starch binder as a paper sizing or binder agent, etc., or any combination thereof. Suitable polymer materials may include synthetic or naturally occurring polymers (or a combination of different polymers), for example, polymer latexes such as styrene butadiene rubber latexes, acrylic polymer latexes, polyvinyl acetate latexes, styrene acrylic copolymer latexes, etc., proteinaceous adhesives such as, for example, casein or soy proteins, etc.; a polyvinyl alcohol (PVOH), etc., or a combination thereof. Examples of suitable polymer materials may include ethyl cellulose, polyvinyl alcohol, polyvinyl chloride, polystyrene, polyvinyl acetate, poly-(methyl, propyl or butyl methacrylate), cellulose acetate, cellulose butyrate, cellulose acetate butyrate, cellulose nitrate, chlorinated rubber, copolymers of the above vinyl monomers, etc. The polymer material may be present in an amount of, for example, from about 0.5 to about 200 parts by weight, per part of the combined weight of the image-forming agent, e.g., leuco dye. Generally from about 5 to about 20 parts by weight may be used. Cellulose esters, such cellulose, acetate butyrate, etc., may be particularly suitable polymer materials for use herein.

For the purposes of the present invention, the term "image-forming agent" refers to an agent which is capable of forming an image(s) on a substrate (e.g., paper web) when exposed to an appropriate wavelength of light, and in the presence of a photo-oxidizing agent. The image formed may be text (e.g., a letter and/or number), a graphic, object, photo, picture, etc. Image-forming agents may include one or more dyes, for example, leuco dyes, other light activated dyes, light activated colorants, light activated pigments, etc. The amount of image-forming agent used that may provide suitable imaging characteristics will depend upon a variety of factors, including the agent use, the substrate that the agent is used with, the particular image-forming conditions, etc. For example, in the case of leuco dyes, amounts from about 0.1 to about 10% (e.g., from about 1 to about 5%) of the particulate solids may be used.

For the purposes of the present invention, the term "leuco dye" refers to compounds which are normally colorless or slightly colored but, when oxidized, may form or are capable of forming different colors which may encompass almost the entire visible region. The leuco dyes which may be used in embodiments of the present invention include, for example, those which are described in U.S. Pat. No. 3,445,234 (Cescon et al.) issued May 20, 1969 (the entire disclosure and contents of which are hereby incorporated by reference), and some examples thereof are illustrated as follows: (1) aminotriarylmethanes; (2) aminoxanthenes; (3) aminothioxanthenes; (4) amino-9,10-dihydroacridines; (5) aminophenoxazines; (6) aminophenothiazines; (7) aminodihydrophenazines; (8) aminodiphenylmethanes; (9) leucoindamines; (10) aminohydrocinnamic acids (cyanoethane, leucomethine); (11) hydrazines; (12) leucoindigoid dyes; (13) amino-2,3-dihydroanthraquinones; (14) tetrahalo-p,p'-biphenols; (15) 2-(p-hydroxyphenyl)-4,5-diphenylimidazoles; and (16) phenethylanilines. Of these leuco dyes, (1) to (9) form dyes when they lose one hydrogen atom, and (10) to (16) dyes when they lose two hydrogen atoms. Illustrative leuco dyes may include Crystal Violet, tris(4-diethylamino-o-tolyl) methane, bis(4-diethylamino-o-tolyl)phenylmethane, bis(4-diethylamino-o-tolyl)-thienyl-2-methane, bis(2-chloro-4-diethylaminophenyl)phenylmethane, 2-(2-chlorophenyl)amino-6-N,N-dibutylamino-9-(2-methoxycarbonyl) phenylxanthene, 2-N,N-dibenzylamino-6-N,N-diethylamino-9-(2-methoxycarbonyl)phenylxanthene, benzo[a]-6-N,N-diethylamino-9-(2-methoxycarbonyl)phenylxanthene, 2-(2chloro-phenyl)-amino-6-N,N-dibutylamino-9-(2-methylphenylcarboxamido)phenylxanthene, 3,6-dimethoxy-9(2-methoxycarbonyl)phenylxanthene, 3,6-diethoxyethyl-9-(2-methoxycarbonyl)phenylxanthene, benzoyl leucomethylene blue, 3,7-bis-diethylaminophenoxazine, etc. Suitable aminotriarylmethanes may include, for example, the acid salts of aminotriarylmethanes wherein at least two of the aryl groups are phenyl groups having: (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyano-ethyl, benzyl, etc.; and (b) a group ortho to the methane carbon atom which is selected from lower alkyl($C_{1-4}$), lower alkoxy($C_{1-4}$, fluorine, chlorine, bromine, etc.; and the third aryl group may be the same as or different from the first two, and when different may be selected from: (a) phenyl which may be substituted with lower alkyl, lower alkoxy, chloro, diphenylamino, cyano, nitro, hydroxy, fluoro, bromo, etc.; (b) naphthyl which may be substituted with amino, di-lower alkylamino, alkylamino, etc.; (c) pyridyl which may be substituted with alkyl, etc.; (d) quinolyl; (e) indolinylidene which may be substituted with alkyl, etc. $R_1$ and $R_2$ may be hydrogen, alkyl of 1-4 carbon atoms, etc. Leuco dyes may be present in an amount of, for example, from about 0.1 to about 10% by weight, such as from about 1 to about 5% by weight, of the solids in the dual wavelength imaging composition. With the leuco form of dyes which have amino or substituted amino groups within the dye structure and which are characterized as cationic dyes, an amine salt-forming mineral acid, organic acid, or an acid from a compound supplying the acid may be employed (also referred to as "couplers"). The amount of acid/coupler may vary, for example, in the range of from about 0.33 to about 1 mol, per mol of amino nitrogen in the dye. In some embodiments, the quantity of acid/coupler is in the range of, for example, from about 0.5 to about 0.9 mol, per mol of amino nitrogen. Representative acids/couplers which may form the required amine salts may include hydrochloric acid, hydrobromic acid, sulfuric acid, phosphoric acid, acetic acid, oxalic acid, p-toluenesulfonic acid, trichloroacetic acid, trifluoroacetic acid, perfluoroheptanoic acid, etc. Other acids such as "Lewis acids" or acid sources which may be employed as acids/couplers in the presence of water or moisture may include zinc chloride, zinc bromide, ferric chloride, etc. Representative leuco dye salts may include tris-(4-diethylamino-o-tolyl) methane zinc chloride, tris-(4-diethylamino-o-tolyl) methane oxalate, tris-(4-diethylamino-o-tolyl) methane p-toluenesulfonate, etc.

For the purposes of the present invention, the term "photo-oxidizing agent" refers to an agent or agents which may be capable of generating radicals upon irradiation with light which may in turn oxidize an image-forming agent, (e.g., a leuco dye). As described in U.S. Pat. No. 4,252,887 (Dessauer), issued Feb. 24, 1981, the entire disclosure and contents of which is hereby incorporated by reference. Some examples of the photo-oxidizing agents may include lophine dimer compounds such as 2,4,5-triarylimidazole dimers (see formula below) as described in U.S. Pat. No. 4,247,618 (Dessauer et al.), issued Jan. 27, 1981, and U.S. Pat. No. 4,311,783 (Dessauer), issued Jan. 19, 1982; azide compounds such as 2-azidobenzoxazole, benzoylazide, 2-azidobenzimidazole, etc., as described in U.S. Pat. No. 3,282,693 (Sagura et al.), issued Nov. 1, 1966; pyridinium compounds such as 3'-ethyl-1-methoxy-2-pyridothiacyanine perchlorate, 1-methoxy-2-methylpyridinium-p-toluenesulfonate, etc., organic halogen compounds such as N-bromosuccinimide, tribromomethyl phenyl sulfone, diphenyliodide, 2-trichloromethyl-5-(p-butoxystyryl)-1,3,4-oxadiazole, 2,6-di-trichloromethyl-4-(p-methoxyphenyl)triazine, etc., as described in U.S. Pat. No. 3,615,568 (Jenkins), issued Oct. 26, 1971; azide polymers as described in Nihon Shashin Gakkai 1968-nen Syunki Kenkyu Happyokai Koenyoshisyu, p 55 (1968), the entire disclosure and contents of all of the aforementioned documents being hereby incorporated by reference. Of these compounds, lophine dimer compounds and organic halogen compounds may be used, with combinations of two such compounds providing a high sensitivity, for example, a combination of: A) an 2,4,5-triphenylimidazolyl dimer of the formula:

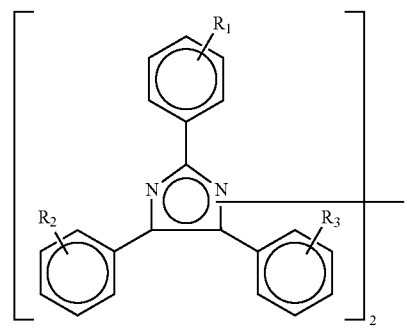

wherein $R_1$ is 2-bromo, 2-chloro, 2-fluoro, 2-alkyl of 1 to 4 carbon atoms, 2,4-dichloro, etc.; $R_2$ is 2-bromo, 2-chloro, 2-fluoro, 4-chloro, 2-alkyl of 1 to 4 carbon atoms, 2-cyano, 2-alkoxy, etc., wherein the alkyl radical is of 1 to 4 carbon atoms; $R_3$ is 3,4-dimethoxy, 3,4-diethoxy, 2,3-dimethoxy, 2,4,6-trimethoxy, 4-alkoxy, etc., wherein the alkyl radical is of 1 to 4 carbon atoms, 3,4-methylenedioxy, etc.; an imidazolyl dimer having an extinction coefficient determined in methylene chloride at from about $10^{-5}$ to about $10^{-3}$ mol/liter at about 350 nm of at least about 4000 liters/mol-cm and at about 400 nm of at least about 250 liters/mol-cm; and at least one compound taken from the group consisting of (B1) a leuco dye that is oxidizable to dye by the imidazolyl radicals; and (B2) an addition polymerizable ethylenically unsaturated monomeric compound. The image-forming particulates of the present invention may contain the specific 2,4,5-triphenylimidazolyl dimers and either a dye in its leuco form, or, in the event that the image-forming agent is photopolymerizable, a compound having ethylenic unsaturation. Both the leuco dye and ethylenically unsaturated compound may be present in the image-forming particulate. Image-forming particulates containing the specific 2,4,5-triphenylimidazolyl dimer and leuco dye may be stabilized to prevent color build-up in the nonimage areas. The following processes may be used to achieve such stabilization: treatment with a solution containing a free radical trap, e.g., hydroquinone, phenidone, etc.; inclusion of precursors of hydroquinone which lead to its generation by heat, e.g., a dihydropyran adduct of ditertiary-butylhydroquinone; inclusion of quinones (photoactivatible oxidants) and hydrogen donor compounds (reductant components) which may be employed to generate hydroquinones by light exposure, for example, at a wavelength distinct from the image-forming exposure; photopolymerizable compounds which act as plasticizers to promote image formation until polymerized when they limit diffusion of image-forming species and prevent formation of images, etc. Additional components which may be present in the image-forming particulates may include: anti-blocking agents, dyes, and white and colored pigments which do not act as sensitizers, etc. In a photopolymerizable composition containing the specific 2,4,5-triphenylimidazolyl dimer and addition polymerizable ethylenically unsaturated compound there may be present a free radical producing, electron donor agent hydrogen donor (hydrogen donor), e.g., organic amines, mercaptans, certain halogen-containing compounds, active methylene compounds, etc. The specific triphenylimidazolyl dimers may be present in an amount of, for example, from about 0.1 to about 10.0% by weight, such as from about 1 to about 5% by weight, of the solids in the dual wavelength imaging compositions. In preparing embodiments of the dual wavelength imaging formulations of the present invention, the leuco dye and the photo-oxidizing agent may be mixed in a proportion (i.e., molar ratio) of from about 0.2:1 to about 5:1, for example from about 0.5:1 to about 2:1.

For the purposes of the present invention, the term "reducing agent" refers to an agent that may inhibit the activation of the photo-oxidizing agent, thus terminating the formation of the one or more images. A reducing agent allowed to exist in the vicinity of the photo-oxidizing agent may immediately reduce the activated photo-oxidizing agent so it loses the ability to oxidize the image-forming agent (e.g., leuco dye). That is, such reducing agent functions as a so-called free radical scavenger which may trap the free radical of the activated photo-oxidizing agent. As specific examples of the reducing agent, there are illustrated hydroquinone compounds and aminophenol compounds which have a hydroxy group in the benzene ring and at least another hydroxy group or amino group in a different position of the benzene ring, as described in U.S. Pat. No. 3,042,515 (Wainer), issued Jul. 3, 1962; cyclic phenylhydrazide compounds, compounds selected from among guanidine derivatives, alkylenediamine derivatives and hydroxyamine derivatives, as described in JP-B-62-39738, the entire disclosure and contents of all of the aforementioned documents of which is hereby incorporated by reference. These compounds may be used alone or as a combination of two or more. However, these examples are not limitative, and other known reducing substances which possess the function of acting on or reacting with oxidants may also be used. For example, the redox couple may comprise 9,10-phenanthrenequinone, alone or in admixture with 1,6- and 1,8-pyrenequinone as the oxidant, with the reductant component comprising from about 10 to 100% of an acyl ester of triethanolamine of the formula:

where R is alkyl of 1 to 4 carbon atoms, and from 0 to about 90% of a $C_1$ to $C_4$ alkyl ester of nitrilotriacetic acid or of 3,3',3'-nitrilotripropionic acid. Triethanolamine triacetate and dibenzylethanolamine acetate are illustrative of such reductant components.

For the purposes of the present invention, the term "electron donor (hydrogen donor) agent" refers to an agent having a reactive atom, usually hydrogen, which is removable and which in the presence of the radical of the substituted 2,4,5-triphenylimidazolyl dimer yields a radical which reacts with the monomeric compound to initiate growth of polymer chains. Free radical producing, electron donor agents and active methylene compounds that may be used in the dual wavelength imaging compositions are described in, for example, column 2, line 50 to column 3, line 3, of U.S. Pat. No. 3,479,185 (Chambers, Jr.), issued Nov. 18, 1969, the entire disclosure and contents of which are hereby incorporated by reference. Examples of suitable electron or hydrogen donor compounds may include compounds that form a stable composition with the hexaphenylbiimidazole compound in the dark. The agent may be an amine, e.g., a tertiary amine. The amine-substituted leuco dyes may be useful, for example, those having at least one dialkylamino group. Also, any leuco triphenylamine dye or various salts of the dye, e.g., the HCl salt of the leuco blue dye can be used. Illustrative dyes may include tris-(4-N,N-diethylamino-o-tolyl)-methane trihydrochloride, bis(4-N,N-diethylamino-o-tolyl)triphenylmethane, bis(4-N,N-diethylamino-o-tolyl) methylenedioxyphenylmethane, leuco neutral shase dye, i.e., bis(4-N,N-diethylamino-o-tolyl)-benzyl thiophenylmethane, Leuco Malachite Green (C.I. Basic Green 4), leuco forms of Crystal Violet, Brilliant Green (C.I. Basic Green 1), Victorial Green 3B (C.I. Basic Green 4), Acid Green GG (C.I. Acid Green 3), Methyl Violet (C.I. Basic Violet 1), Rosaniline (C.I. Basic Violet 14), etc. The salt forms, e.g., HCl salt, salts with a Lewis acid, sulfuric acid salts, p-toluene sulfonic acid salts, etc., of the leuco dye is preferred for use. Additional suitable, electron donor agents which can be used singly or in combination include aniline, N-methylaniline, N,N-diethylaniline, N,N-diethylcresidine, triethanolamine, ascorbic acid, 2-allylthiourea, sarcosin, N,N-diethylglycine, trihexylamine, diethylcyclohexylamine, N,N,N',N'-tetramethylethylenediamine, diethylaminoethanol, ethylaminoethanol, N,N,N',N'-ethylenediaminotetracetic acid, N-methylpyrrolidone, N,N,N',N'',N''-pentamethyldiethylenetriamine, N,N-diethylxylidene, N,N'-dimethyl-1,4-piperazine, N-β-hydroxyethylpiperidine, N-ethylmorpholine, and related amino compounds. While the tertiary amines and especially the aromatic tertiary amines having at least one $CH_2$ group adjacent to the nitrogen atoms may be useful, a combination of two radical generating agents such as a tertiary amine, e.g., N,N-dimethylaniline, and a secondary amine, e.g., N-phenylglycine, may also be useful. In a dual wavelength imaging composition containing the hexaphenylbiimidazole, monomeric compound and electron donor agent, the light-sensitivity, speed, or degree of polymerization may be dependent on the concentration of the hexaphenylbiimidazole and electron donor agent. Useful dual wavelength imaging compositions may be limited in part by the solubilities of the components. When a leuco dye is used as the electron donor agent, a mole ratio of leuco dye to the hexaphenylbiimidazole of, for example, from about 1.0 to about 1.4 may provide the best results as to photospeed and stability.

For the purposes of the present invention, the term "plasticizer" refers to the conventional meaning of this term as an agent which softens the polymer material, thus providing flexibility, durability, etc. Suitable plasticizers for use herein are disclosed in, for example, column 10, lines 20 to 73 of U.S. Pat. No. 3,658,543 (Gerlach, Jr., et al.), issued Apr. 25, 1972, the entire disclosure and contents of which are hereby incorporated by reference. Suitable plasticizers may include polyethylene glycols such as the commercially available carbowaxes, and related materials, such as substituted phenolethylene oxide adducts, for example, polyethers obtained from o-, m- and p-cresol, o-, m- and p-phenylphenol and p-nonylphenol, including commercially available materials such as the "Igepal" alkyl phenoxy polyoxyethylene ethanols, (e.g., nonylphenoxypoly(ethyleneoxy)-ethanol); acetates, propionates, butyrates and other carboxylate esters of ethylene glycol, diethylene glycol, glycerol, pentaerythritol and other polyhydric alcohols; alkyl phthalates and phosphates such as dimethyl phthalate, diethyl phthalate, dioctyl phthalate, tributyl phosphate, trihexyl phosphate, trioctyl phosphate, triphenyl phosphate, tricresyl phosphate and cresyl diphenyl phosphate; sulfonamides such as N-ethyl-p-toluenesulfonamide; etc. The plasticizers may be used in a concentration in the range of, for example, from about 1:20 to about 5:3, such as from about 1:5 to about 1:2, based on the weight of polymer material used.

For the purposes of the present invention, the term "solvent," unless specified otherwise, refers not only to a liquid in which a solute is dissolved, but also to a liquid in which solids are suspended or dispersed. A solvent is any liquid, including a liquid solution, in which solids of the present invention are dispersed. Suitable solvents for use herein include aqueous solvents (e.g., water, or water with another water-miscible solvent), etc.

For the purposes of the present invention, the term "solids portion" of a dual wavelength imaging composition refers to the particulates of the present invention and anything contained in or bound to the particulates of the present invention. The solids portion may include polymer materials, plasticizers, photo-oxidizing agents, reducing agents, image-forming agents (e.g., leuco dyes), acids/couplers, etc. The particulates of the present invention may be dissolved or suspended in a liquid solvent to form a coating that is applied to one or both sides of a substrate (e.g., paper web).

For the purposes of the present invention, the term "paper filler" refers commonly to mineral products (e.g., calcium carbonate, such as precipitated calcium carbonate (PPC), granulated calcium carbonate (GCC), kaolin clay, etc.) which may be used in paper making to reduce materials cost per unit mass of the paper, increase opacity, increase smoothness, etc. These mineral products may be finely divided, for example, in the size range of up to about 20 microns (e.g., from about 0.5 to about 5 microns). See also G. A. Smook, Handbook for Pulp and Paper Technologists ($2^{nd}$ Edition, 1992), page 225, the entire contents and disclosure of which is herein incorporated by reference, for a general description of paper fillers that may be useful herein.

For the purposes of the present invention, the term "paper starch binder" refers to a binder agent for paper webs which comprises starch, a starch derivative, etc., or a combination thereof. Suitable starch binders may be derived from a natural starch, e.g., natural starch obtained from a known plant source, for example, wheat, maize, potato, tapioca, etc. The starch binder may be modified (i.e., a modified starch) by one or more chemical treatments known in the paper starch binder art, for example, by oxidation to convert some of —$CH_2OH$ groups to —COOH groups, etc. In some cases the starch binder may have a small proportion of acetyl groups. Alternatively, the starch binder may be chemically treated to render it cationic (i.e., a cationic starch) or amphoteric (i.e., an amphoteric starch), i.e., with both cationic and anionic charges. The starch binder may also be a starch converted to a starch ether, or a hydroxyalkylated starch by replacing some —OH groups with, for example, —$OCH_2CH_2OH$ groups, —$OCH2CH_3$ groups, —$OCH_2CH_2CH_2OH$ groups, etc. A further class of chemically treated starch binders which may be used are known as the starch phosphates. Alternatively, raw starch may be hydrolyzed by means of a dilute acid, an enzyme, etc., to produce a starch binder in the form of a gum of the dextrin type. See also G. A. Smook, Handbook for Pulp and Paper Technologists ($2^{nd}$ Edition, 1992), page 285, the entire contents and disclosure of which is herein incorporated by reference, for a general description of starch binders that may be useful herein.

For the purposes of the present invention, the term "paper pigment" refers to a material (e.g., finely divided particulate matter) which may be used or may be intended to be used to affect optical properties of the paper web. Paper pigments may also function as paper fillers (and vice versa), and may include titanium dioxide, pigmented PCC, pigmented GCC, etc. See also G. A. Smook, Handbook for Pulp and Paper Technologists ($2^{nd}$ Edition, 1992), pages 286-88, the entire contents and disclosure of which is herein incorporated by reference, for a general description of paper pigments that may be useful herein.

For the purposes of the present invention, the term "cationic dye fixing agents" refers to cationic salts which may complex with anionic dyes to form an agglomerate, complex, aggregate, etc. These cationic salts may include metal salts such alkali metal salts, alkaline earth metal salts, transition metal salts of, for example, halides, sulfates, silicates, etc., such as sodium chloride, calcium chloride, magnesium chloride, aluminum chloride, sodium sulfate, aluminum sulfate, potassium chloride, sodium aluminum sulfate, vanadium chloride, magnesium sulfate, sodium silicates, etc.

For the purposes of the present invention, the term "anti-static agents" refers to conductive materials which lower surface and volume resistivity. Suitable "anti-static agents" may include quaternary salt type cationic anti-static agents, for example, alkali metal and ammonium salts of poly-(styrene sulfonic acid), sulfonated styrene/maleic anhydride copolymer, poly(acrylic acid), poly-(methacrylic acid), poly (vinyl phosphate) and free acids thereof, copolymers of dimethyl allyl ammonium chloride and diacetone acrylamide, quaternary acrylics, copolymers of dimethyl diallyl ammonium chloride and N-methylacrylamide, poly(dimethyl diallyl) ammonium chloride, quaternary cellulose acetate, etc. These anti-static agents may be included in the coating compositions in amounts of from about 0.5 to about 25% by weight, more typically in amounts of from about 1 to about 10% by weight. Papers used herein may have a brightness of about 75 or greater.

For the purposes of the present invention, the term "brightness" refers to the diffuse reflectivity of paper, for example, at a mean wavelength of light of 457 nm. As used herein, brightness of the paper web may be measured by, for example, in terms of GE Brightness or ISO Brightness.

For the purposes of the present invention, the term "opacity" refers to the ability of a paper to hide things such as images on subsequent sheets or printed on the back, e.g., to minimize, prevent, etc., show-through, etc. As used herein, opacity of the paper web may be measured by, for example, in terms of TAPPI opacity and show-through. TAPPI opacity may be measured by T425 om-91.

For the purposes of the present invention, the term "print quality" refers to those factors, features, characteristics, etc., that may influence, affect, control, etc., the appearance, look, form, etc., of the formed image on the paper. As used herein, print quality of the paper web may be measured by, for example, in terms of one or more of: (1) print density/contrast (e.g., for BW/color/monochrome); (2) color gamut or color richness; (3) print gloss or print mottle; (4) etc. For example, black optical print density may be measured by TAPPI method 1213 sp-03. Print mottle may be measured based on 2nd cyan values according to the method disclosed in U.S. Published Application No. 20060060317 (Roding, et al.), published Mar. 23, 2006, the disclosure and contents of which are herein incorporated by reference. Papers used herein may have print quality of about 0.65 or greater, for example, about 0.8 or greater or about 1.0 or greater.

For the purposes of the present invention, the term "paper smoothness" refers to the extent to which the paper surface deviates from a planar or substantially planar surface, as affected by the depth of the paper, paper width, numbers of departure from that planar surface, etc. As used herein, the paper smoothness of a paper web may be measured by, for example, in terms of Sheffield smoothness. Sheffield smoothness may be measured by TAPPI test method T 538 om-01, in Sheffield Units (SUs). Papers used herein may have a smoothness of about 450 SUs or greater.

For the purposes of the present invention, the term "liquid" refers to a non-gaseous fluid composition, compound, material, etc., which may be readily flowable at the temperature of use (e.g., room temperature) with little or no tendency to disperse and with a relatively high compressibility.

For the purposes of the present invention, the term "solids content" refers to the percentage of non-volatile, non-liquid components (by weight) that are present in the composition, coating, etc.

For the purposes of the present invention, the term "size press" refers to a device, equipment, machine, etc., which may be used to treat, apply, coat, etc., a dual wavelength imaging composition to one or more sides or surfaces of the substrate (e.g., paper web), for example, just after the paper web has been dried for the first time. Size presses may include a puddle size press, a metering size press, etc. See also G. A. Smook, Handbook for Pulp and Paper Technologists ($2^{nd}$ Edition, 1992), pages 283-86, the entire contents and disclosure of which is herein incorporated by reference, for a general description size presses that may be useful herein.

For the purposes of the present invention, the term "flooded nip size press" refers to a size press having a flooded nip (pond), also referred to as a "puddle size press." Flooded nip size presses may include vertical size presses, horizontal size presses, etc.

For the purposes of the present invention, the term "metering size press" refers to a size press that includes a component for spreading, metering, etc., deposited, applied, etc., a coating of a dual wavelength imaging composition on a substrate (e.g., paper web) side or surface. Metering size presses may include a rod metering size press, a gated roll metering size press, a doctor blade metering size press, etc.

For the purposes of the present invention, the term "rod metering size press" refers to metering size press that uses a rod to spread, meter, etc., a coating of a dual wavelength imaging composition on substrate (e.g., paper web). The rod may be stationary or movable relative to the substrate.

For the purposes of the present invention, the term "gated roll metering size press" refers to a metering size press that may use a gated roll, transfer roll, soft applicator roll, etc. The gated roll, transfer roll, soft applicator roll, etc., may be stationery relative to the substrate (e.g., paper web), may rotate relative to the substrate, etc.

For the purposes of the present invention, the term "doctor blade metering size press" refers to a metering press which may use a doctor blade to spread, meter, etc., a coating of a dual wavelength imaging composition on the substrate (e.g., paper web) surface.

For the purposes of the present invention, the term "room temperature" refers to the commonly accepted meaning of room temperature, i.e., an ambient temperature of 20° to 25° C.

For the purpose of the present invention, the term "treating" with reference to the of dual wavelength imaging composition may include depositing, applying, spraying, coating, daubing, spreading, wiping, dabbing, dipping, etc., wherein the composition may remain (partially or wholly) on the surface of the substrate (e.g., paper web), may (partially or wholly) penetrate the surface, impregnate the interior, etc., of the substrate (e.g., paper web), etc.

For the purposes of the present invention, the term "coating" refers to one or more layers, coverings, films, skins, etc., formed, created, prepared, etc., from a dual wavelength imaging composition which remains predominantly on the surface(s) of the substrate (e.g., paper web).

For the purposes of the present invention, the term "remains predominantly on the surface(s) of the substrate (e.g., paper web)" refers to a coating of a dual wavelength imaging composition which remains primarily on the surface of the substrate, and not being absorbed by or into the interior of the substrate (e.g., paper web).

For the purpose of the present invention, the term "treating" with reference to the dual wavelength imaging composition may include depositing, applying, spraying, coating, daubing, spreading, wiping, dabbing, dipping, etc.

DESCRIPTION

Embodiments of the present invention may include dual wavelength image-forming particulate comprising a matrix of polymer material and containing: one or more image-forming agents; a photo-oxidizing agent which is activated at a first wavelength of light to cause the one or more image-forming agents to form one or more images; and a reducing agent which is activated at a second wavelength of light to cause termination of the formation of the one or more images. Embodiments of the present invention may also comprise imaging compositions comprising a solvent and a plurality of dual wavelength image-forming particulates present in the solvent. Embodiments of the present invention may also involve a process for treating at least one side or surface of a substrate (e.g., paper web) with these dual wavelength image-forming particulates. Embodiments of the present invention may also comprise a substrate (e.g., paper web) treated (e.g., coated) with these dual wavelength image-forming particulates on at least one side or surface of the substrate. Embodiments of the present invention may also involve a method wherein a substrate (e.g., paper web) treated with these dual wavelength image-forming particulates on at least one side or surface of the substrate are then subjected to a first wave length of light to form one or more images on the substrate, and then subjected to a second wave length of light to terminate the formation of any further images. Embodiments of the present invention may also involve processes for forming the dual wavelength imaging composition.

Embodiments the dual wavelength image-forming particulates, imaging compositions, processes, methods, etc., of the present invention may provide several advantageous properties and benefits, including: (1) a dual wavelength-sensitive color forming formulation which may initially develop one or more color images upon exposure to one wavelength of light, followed by termination of color formation by exposure to a second and different wavelength of light; (2) a dual wavelength imaging formulation comprising image-forming polymeric particulates which may be processed economically and efficiently; (3) the ability of image-forming polymeric particulates in the dual wavelength imaging formulation to be dispersed in water, a starch/water paper sizing composition, etc.; (4) the ability to provide appropriate particulate size reduction of the image-forming polymeric particulates in the dual wavelength imaging formulation; (5) coating of the particulate size-reduced dual wavelength imaging formulation onto one or both sides or surfaces of a substrate (e.g., paper web); (6) the ability to sequentially expose the treated substrate (e.g., coated paper web) to a first wavelength of light to develop one or more color images, followed by exposure to a second wavelength of light to terminate further development of color image(s), for example, where color image formation is triggered by UV light, with subsequent visible light exposure to prevent further color image formation in areas unexposed to UV light; etc.

The combination of the above properties and benefits, and the ability to use these embodiments in on-line paper manufacturing process may allow production of, for example, one-of-a-kind paper with unique set of properties, which may be very beneficial for image creation on the paper surface in the absence of any ink transfer. Embodiments of the present invention may also allow substitution for thermal printing in point-of-purchase applications, thus reducing the amount of energy needed to print, improve the quality of the printed receipt in terms of its durability and archival storage, etc. Embodiments of the present invention may also allow for shared office or home office use, thus potentially replacing traditional laser transfer and ink jet transfer printers.

Embodiments of dual wavelength image-forming particulates useful in the embodiments of the dual wavelength imaging compositions of the present invention may comprise thermoplastic or thermosettable particulate matrices. The image-forming particulates may comprise a polymeric matrix, (e.g., shell, sphere, substrate, etc.) in which are contained (e.g., embedded, incorporated, encapsulated, associated, etc.) the image-forming agents, for example, dyes (e.g., leuco dyes), photo-oxidizing agents, reducing agents, plasticizers, acids/couplers, electron donating agents, etc. The particulates may be free-flowing; that is, they do not agglomerate and are detached from each other. In one embodiment of the present invention, the particulates may also be fusible or crosslinkable with each other and/or a surrounding matrix.

In one embodiment, the dual wavelength image-forming particulates may be prepared from a polymer, co-polymer, or polymer blend solvated by an appropriate solvent, and then combined with the image-forming agents and associated photo-oxidizing and reducing agents, etc. Optionally, crosslinkers, catalysts, plasticizers, stabilizers, and other desirable additives may be added to the mixture. The mixture may then be atomized into air, or homogenized in a second immiscible liquid, to produce microscopic droplets. Either by evaporation or liquid-liquid extraction, the solvent may then be removed from the droplets, precipitating the polymer from solution and effectively solidifying the droplets into hard-walled polymeric particulates containing the image-forming agents and other optional additives.

Image-forming particulates may be produced by first forming a solution comprising the polymer or polymer mixture that is to form the particulate matrix, the image-forming agents and associated photo-oxidizing and reducing agents, optional additives to promote crosslinking or other desirable properties, and a suitable solvent. The matrix-forming polymer may be a thermoplastic, a thermoset, an elastomer, or a mixture of polymers, optionally mixed with crosslinkers (i.e., thermosettable precursors), plasticizers, or other desirable additives, etc. A "suitable solvent" may be a solvent capable of dissolving the polymer to form a polymer solution that is homogeneous on a macroscopic scale and is free-flowing. The polymer may be solvated to a concentration between, for example, about 0.5 wt % and about 90 wt %. For example, the polymer may be solvated at as high a concentration as possible where solution atomization or break-up into droplets is still achievable, such as by atomization or suspension and agitation in a second immiscible liquid. This may lead to solutions with a polymer content, for example, between about 10 wt % and about 50 wt %.

In one embodiment of this process, the formation of droplets may be achieved by atomizing the polymer solution (with the other components such as the image-forming agents, photo-oxidizing and reducing agents, etc.) into a drying gas atmosphere where solvent removal proceeds by simple evaporative drying. In this embodiment, the droplets may be automatically cooled as the solvent evaporates due to the latent heat of vaporization associated with such a phase change. Such atomization techniques may include, for example, high-pressure atomization, two-fluid atomization, rotary atomization, ultrasonic atomization, etc. The type of technique used, as well as the operating parameters, will depend on the desired particle size distribution, the composition of the solution being sprayed, etc.

Droplet formation may be alternatively accomplished by introducing the polymer-solvent solution (with the other components such as the image-forming agents, photo-oxidizing and reducing agents, etc.) into a second, immiscible liquid in which the polymer is immiscible and the polymer solvent is only slightly soluble. With agitation the polymer solution may be broken up into dispersed droplets, forming a suspension of polymer solution droplets distributed within the second liquid. The second liquid may be chosen such that it is not a solvent for the polymer, and is somewhat incompatible with the polymer solvent such that the overall polymer solution is dispersible as discrete droplets within the second liquid. The second liquid should provide a reasonable solubility for the polymer solvent such that the polymer solvent is extracted from the droplets in a manner analogous to evaporative drying. Once sufficient solvent has been removed, the polymer will phase separate and form a polymer matrix at the droplet surface, as in the case of evaporative drying. Further extraction of the solvent results in particulates comprising the polymer material. The extent to which other components (image-forming agents, photo-oxidizing and reducing agents, etc.) remain in the droplets during solvent extraction will depend on the component's diffusivity in the polymer and compatibility with the polymer, etc. Components such as crosslinkers, catalysts, plasticizers, pigments, etc., will generally remain within the droplet upon solvent removal since these agents are typically chosen to be compatible with the polymer or polymer solvent. When the particulates have sufficiently solidified, they may be collected by filtration, centrifugation, sedimentation, flotation, or other separation methods known in the art.

This second liquid may be advantageously water, as many polymer solvents are immiscible and only slightly soluble in water. Other examples include hydrophobic liquids such as fluorocarbons, silicone fluids, etc. Emulsifying agents may also be added to the second liquid or the polymer solution to promote and stabilize the suspension and particle size distribution of polymer solution droplets.

Utilizing these of embodiments of this process, a final product comprising dual wavelength image-forming particulates having a flowable, dispersible, residue-free, thermoplastic or thermosetting may be obtained. The polymer, co-polymer, or polymer blend may be chosen from any existing polymers, provided there exists a suitable solvent capable of dissolving the polymer. The particulates may possess reactive functionalities, either built into the polymer chains or added to the formulation in the form of crosslinking or other reactive groups, that allow the particulates to fuse to each other or to a surrounding matrix during subsequent use.

Figure 2:
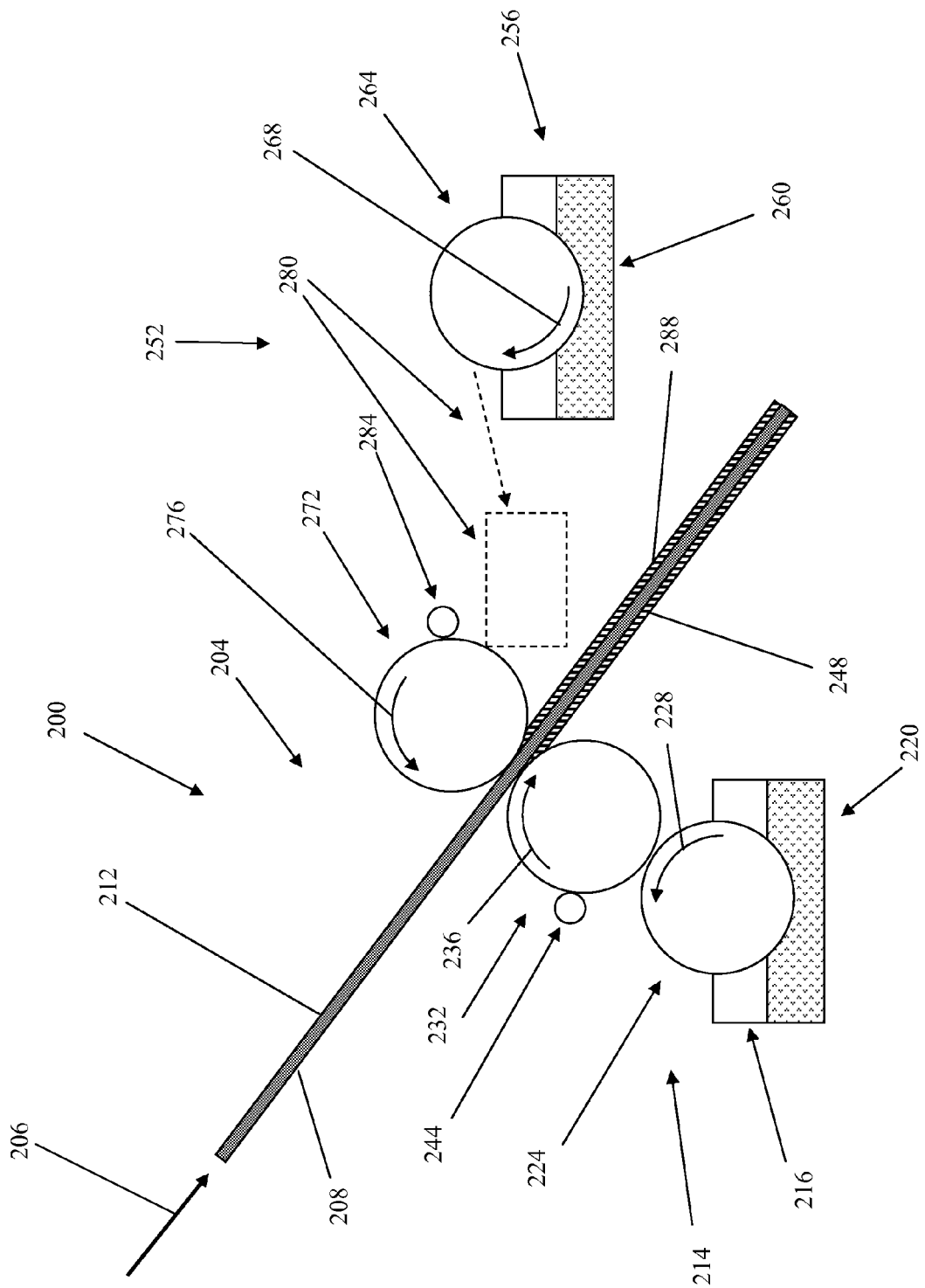
FIG. 2 is a schematic diagram illustrating an embodiment of a method for coating a paper web with a dual wavelength imaging composition according to the present invention using a metering rod size press.

Embodiments a process of the present invention are further illustrated in FIGS. 1-2. Referring to FIG. 1, an embodiment of a process illustrating the steps for preparing dual wavelength imaging composition, for coating a paper web with a dual wavelength imaging composition according to the present invention using a metering rod size press, and for imaging of the coated paper is shown, as indicated generally as 100. Process 100 includes the initial step 102 of forming a polymer solution. This polymer solution from step 102 may be used to form a solid polymer in the form of a sheet, film, etc., of polymer, as indicated by 104, or may be sprayed, as indicated by 106, to form polymer particulates, which may then be dispersed in starch in water mixture, as indicated by step 108. The solid polymer 104 may be coarsely ground, as indicated by step 112, dispersed in a solvent (e.g., water), as indicated by step 116, to form a slurry, and then wet slurry ground, as indicated by step 120. Alternatively, solid polymer 104, after coarse grinding in step 112, may be subjected to cryogenic grinding, as indicated by step 124, and then dispersed in a solvent (e.g., water), as indicated by step 128. As further shown in FIG. 1, the wet slurry ground polymer particulates from step 120, the cryogenic ground and dispersed polymer particulates from step 128, or the sprayed and dispersed polymer particulates from step 108 may be coated, as indicated by step 132, onto one or both sides or surfaces of paper web by using, for example, a rod metering size press. This coated paper web may then be exposed, as indicated by step 136, to form one or more images on the coated paper web.

An embodiment of the method of the present invention for coating a paper web with a dual wavelength imaging composition is further illustrated in FIG. 2. Referring to FIG. 2, an embodiment of a system for carrying out an embodiment of the method of the present invention is illustrated which may be in the form of, for example a rod metering size press indicated generally as 200. Size press 200 may be used to coat a paper web, indicated generally as 204. Web 204 moves in the direction indicated by arrow 206, and which has a pair of opposed sides or surfaces, indicated, respectively, as 208 and 212.

Size press 200 includes a first assembly, indicated generally as 214, for applying the dual wavelength imaging composition to surface 208. Assembly 214 includes a first reservoir, indicated generally as 216, provided with a supply of a dual wavelength imaging composition, indicated generally as 220. A first take up roll, indicated generally as 224 which may rotate in a counterclockwise direction, as indicated by curved arrow 228, picks up an amount of the dual wavelength imaging composition from supply 220. This amount of dual wavelength imaging composition that is picked up by rotating roll 224 may then be transferred to a first applicator roll, indicated generally as 232, which rotates in the opposite and clockwise direction, as indicated by curved arrow 236. (The positioning of first take up roll 224 shown in FIG. 2 is simply illustrative and roll 224 may be positioned in various ways relative to first applicator roll 232 such that the dual wavelength imaging composition is transferred to the surface of applicator roll 232.) The amount of dual wavelength imaging composition that is transferred to first applicator roll 232 may be controlled by metering rod 244 which spreads the transferred composition on the surface of applicator roll 232, thus providing relatively uniform and consistent thickness of a first dual wavelength imaging coating, indicated as 248, when applied onto the first surface 208 of web 204 by applicator roll 232.

As shown in FIG. 2, size press 200 may also be provided with a second assembly indicated generally as 252, for applying the dual wavelength imaging composition to surface 212. Assembly 252 includes a second reservoir indicated generally as 256, provided with a second supply of a dual wavelength imaging composition, indicated generally as 260. A second take up roll, indicated generally as 264 which may rotate in a clockwise direction, as indicated by curved arrow 268, picks up an amount of the dual wavelength imaging composition from supply 260. This amount of dual wavelength imaging composition that is picked up by rotating roll 264 may then be transferred to second take up roll, indicated generally as 272, which rotates in the opposite and counterclockwise direction, as indicated by curved arrow 276. As indicated in FIG. 2 by the dashed-line box and arrow 280, second take up roll 264 may be positioned in various ways relative to second applicator roll 272 such that the dual wavelength imaging composition is transferred to the surface of applicator roll 272. The amount of dual wavelength imaging composition that is transferred to second applicator roll 272 may be controlled by a second metering rod 284 which spreads the transferred composition on the surface of applicator roll 272, thus providing relatively uniform and consistent thickness of the second dual wavelength imaging coating, indicated as 288, when applied onto the second surface 212 of web 204 by applicator roll 272.

It should be appreciated that the embodiments illustrated in FIGS. 1 to 2 are provided to illustrate the teachings of the present invention. Alterations or modification within the skill of the art of the embodiments in FIGS. 1 to 2 are considered within the scope of the present invention, so long as these alterations or modifications operate in a same or similar manner, function, etc.

In one embodiment of the present invention, the polymer material may be a cellulose ester such as cellulose acetate butyrate. In one embodiment, the polymer material may comprise from about 40 to about 99% of the solids portion of dual light imaging composition of the present invention. In another embodiment, the polymer material may comprise about 50 to about 99% of the solids portion in the dual light imaging composition.

In one embodiment, a photo-oxidizing agent may comprise about 1 to about 10%, while the reducing agent comprises from about 0.2 to about 6%, of the solids portion of the dual wavelength imaging composition of the present invention. In another embodiment, the photo-oxidizing agent may comprise about 2 to about 6%, while the reducing agent comprises from about 1 to about 3%, of the solids portion of the dual wavelength imaging composition of the present invention.

In one embodiment, one or more leuco dyes may collectively comprise from about 0.1 to about 10% of the solids portion of a dual light imaging composition of the present invention. In one embodiment, one or more leuco dyes may collectively comprise from about 1 to about 5% of the solids portion of a dual light imaging composition of the present invention.

In one embodiment, acids/couplers may collectively comprise about 0.1 to about 20% of the solids portion of a dual light imaging composition of the present invention. In one embodiment, acids/couplers may collectively comprise from about 1 to about 6% of the solids portion of a dual light imaging composition of the present invention.

In one embodiment, at least some of the particulates may be about 10 microns or less in diameter. In another embodiment, at least some of the particulates may be about 5 microns or less in diameter. In yet another embodiment, at least some of the particulates may be about 3 microns or less in diameter.

In one embodiment of the present invention, imaging-forming particulates may be prepared from a formulation shown in the following table:

TABLE 1

| | Useful Range (%) | Typical Range (%) |
|---|---|---|
| Polymer Materials | 40-99 | 50-80 |
| Plasticizers | 0-45 | 10-20 |
| Oxidizing Agents | 1-10 | 2-6 |
| Leuco dyes | 0.1-10 | 1-3 |
| Acids/Couplers | 0.1-20 | 1-6 |
| H-donors (Electron Donor Agents) | 4-20 | 8-15 |
| Reducing Agents | 0.2-6 | 1-3 |

In one embodiment of the present invention, imaging-forming particulates may be prepared using an organic solvent in order to homogenize all of the ingredients shown in the above table and to provide a solution thereof. This solution may then be cast in order to remove the solvent, thus forming large polymeric particulates. These larger particulates may then be broken up, wet ground in water/starch slurry to obtain a smaller, finer particle size (e.g., about 10 microns or less, for example, about 5 microns or less, or about 3 microns or less) of the polymeric particulates entrapping the color sensitive formulation, to provide the imaging composition. This dispersion of imaging composition may be used to treat (e.g., coat) a substrate surface (e.g., paper web surface) a substrate surface (e.g., paper web surface) surface using rod metering size press, followed by drying, etc. This treated substrate (e.g., coated paper web) may then be subjected to a first wavelength of light (e.g., in the range of from about 300 to about 350 nm) to activate and cause the formation of images, followed by subjecting the activated substrate (e.g., paper web) to a second wavelength of light (e.g., in the range of from about 360 to 450 nm) to termination the formation of images on the surface of the substrate (e.g., paper web).

EXAMPLES

Example 1

Dual wavelength image-forming particulates may be prepared as follows:

Spray Equipment:

The particulates may be sprayed using two types of spraying equipment. For small quantities of material (e.g., 20 grams of solids dissolved in 200 grams of solvent), a Preval portable Spray Gun #267 (Precision Valve Corporation, Yonkers, N.Y.) is used. This is a hand-held device that uses an aerosol spray can to pressurize the solution through a 0.8 mm nozzle, producing particles in the 20-50 micron size range (particles of larger size may also present).

For larger quantities of material (e.g., 1 kilogram of solids in 10 kilograms of solvent), a HVLP Spray Gun may be used. This gun may be pressurized by an air compressor, and the pressure of the system may be varied. It is found that a maximum pressure of the system (approximately 45 PSI) may provide the best results. The solution may be sprayed, for example, for a period of 15 seconds, and then a 45-second break may be needed to allow the pressure in the system to return back to 45 PSI. The HVLP Spray Gun may use a 1.4 mm nozzle, and may provide particles in the 10-20 micron size range with occasional larger particles (20-50 microns). The spray gun may also provide a mechanism for regulating the ratio of liquid to air as the solution is introduced into the nozzle. By adjusting this knob, it may be possible to produce particles in the 10 micron range with virtually no particles bigger than 20 microns. Using these liquid/air parameters may require larger amounts of air relative to liquid, thus requiring longer operating times.

For larger scale applications, the aforementioned method of spraying may be used. This method is referred to as the "two fluid nozzle spray" method. Another type of spraying method that may be used on the industrial scale is called the "rotary atomization spray" method. This technique uses a pressurized main feed that exits through round atomizer rotating at a high speed.

Solvent:

For spraying small quantities of materials, methylene chloride may be used as the solvent. The ingredients used in the formulations may be dissolved in methylene chloride. For small scale sprays with a disposable Preval gun, methylene chloride may be used since the aerosol can run out before the solvent could do any appreciable damage to the spray gun. When spraying larger amounts of material, a solvent such as acetone may be used. Acetone dissolves the components fairly well, and a nice powder may be obtained after spraying.

Acetone may react with p-toluenesulfonic acid (PTSA) due to an acid-catalyzed condensation of the acetone. To minimize the chances of this happening, the PTSA may be the last ingredient added when the mixture is being prepared. By maintaining cooler temperatures, keeping the concentration of PTSA to a minimum and limiting the time the two ingredients are in contact with each other, this potential reaction may be avoided.

Container for Collecting the Spray:

For small scale quantities, a cardboard box lined with tinfoil may be used to collect the spray. The box used to collect the spray from the Preval hand sprayer may be, for example, 15 inches high, 22 inches wide and 20 inches in length. The box may be placed in a fume hood, and the solution may be sprayed horizontally into the box. Alternatively, the box may be, for example, 48 inches high, 22 inches wide and 31 inches deep. This taller box allows for a longer "time of flight" for the droplet, giving the solvent more time to evaporate. The result is that a dry powder may be collected on the bottom floor of the box, instead of a paste consisting of solvent and powder. Once the dry powder is produced, it may be collected by scraping off the material.

Another box constructed of stainless steel sheets may also be used with the HVLP spray gun. This box may be, for example, 24 inches wide and 48 inches high to provide the needed time of flight for the droplet to evaporate. In addition, this box may be expanded to 40 inches in length to accommodate the HVLP sprayer. At a shorter length, the powder may stick to the back wall of the box as the forward thrust from the HVLP gun is greater than that of the Preval sprayer.

In addition, an outlet pipe may be constructed at the bottom of the container to allow the evaporated solvent to exit the box. This pipe then exits into a fume hood to allow safe removal of the solvent vapors. This exit pipe is useful when spraying larger amounts of material. Otherwise, the atmosphere within the box may become oversaturated with solvent. The solvent then condenses at the bottom of the container, forming a paste instead of a powder. Another way to avoid these supersaturated conditions is to spray the solution in intervals.

On a small scale, 35% of the solid sprayed may be collected. When the HVLP spray gun is used, the yields may reach as high as 75-80%. In general, it is easier to recover large amounts of powder as a smaller percentage is lost clinging to the sides of the box, etc. In a larger scale facility, larger amounts of solvents may be evaporated, and these vapors may need to be collected and recycled. Condensers may also be needed along the exit route to ensure that this process occurs. Filters may also be needed along the exit path to contain smaller particles of the powder that is being deposited, while at the same time allowing the solvent vapors to escape.

Example 2

The preparation and imaging of a paper web coated with a dual wavelength imaging composition is as follows:

Step 1—Formulation Dissolution in Solvent

Components of the formulation dissolved in the solvent until completely homogeneous solution is obtained. The solvent may be chosen based on the subsequent workup of the homogeneous solution to obtain smaller particle sizes, by spraying (Step 2, below), casting and grinding (Steps 3, 4 and 6 or 7, below), etc. In small laboratory conditions acetone may be chosen for spraying (Step 2), while methylene chloride may be chosen for solid polymer casting (Step 3).

Step 2—Polymer Particle Production Via Spraying

Parameters such as air pressure, solvent/solids ratio, and spray gun nozzle diameter may be varied to minimize particle size. Particles as small as 30-50 microns may be obtained.

Step 3—Solid Polymer Production for Subsequent Grinding

Layers of solid polymer forming large pieces may be produced by casting the solution from Step 1 and air drying. Sufficient time is allowed for complete solvent evaporation. Additional time in a vacuum oven may be used to ensure that all of the solvent escapes.

Step 4—Rough Grinding of Solid Polymer Obtained in Large Pieces

Solids obtained on Step 3 may be roughly ground with a coffee grinder to reduce their size below 1 mm.

Step 5—Solid Particle Dispersion

Particles from both Steps 2 and rougher particles from Step 4 may be dispersed in a warm (65° C.) starch/water dispersion. No agglomeration may occur, but particles may settle due to gravity, especially in the case of Step 4. Efficient stirring may be employed during dispersion with the starch/water temperature not exceeding 75° C. Particles may be optionally dispersed in a surfactant/water mixture with subsequent addition to a starch/water mixture. The surfactant is used in the surfactant/water mixture to prevent starch coagulation.

Step 6A—Pathways for Particle Size Reduction—Cryogenic Grinding

Particles obtained on Step 4 may be reduced in size via cryogenic grinding. Dry particles may be ground in the presence of liquid nitrogen. If cryogenic grinding is used, the solid particles obtained may need to be further dispersed for easy delivery at the mill (see Step 6B below).

Step 6B—Pathways for Particle Size Reduction—Wet Slurry Grinding

Wet grinding in the presence of ceramic media may be carried out on a horizontal mill. Wet media may be provided from a starch/water dispersion obtained from Steps 4 and 5. By using wet grinding, a particle/starch/water slurry may be obtained which is ready to be delivered to the mill. Parameters in wet grinding may include: the time in the mill, the ceramic media used, the ceramic media/particle loading ratio, the mill rotation speed, etc.

Two-step wet grinding may be used if dispersed particles from Step 4 are used. Starting with the Step 4 particles, a slurry with at least some of the particles having a particle size below 10 microns (e.g. below 5 microns) may be obtained in 4-5 hrs.

Step 7—Coating with Rod Metering Size Press

Particles from Step 6A or 6B may be coated on a paper web using a rod metering size press, yielding an even and smooth coating on paper.

Step 8—Exposure

The coated paper web from Step 7 may be subjected to a first wavelength of light (e.g., in the range of from about 300 to about 350 nm) to activate and cause the formation of images, followed by subjecting the activated paper web to a second wavelength of light (e.g., in the range of from about 360 to 450 nm) to terminate the formation of images on the surface of the paper web.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A process comprising the following steps:
   (a) providing a substrate having first and second surfaces; and
   (b) providing a plurality of dual wavelength imaging particulates, wherein the particulates each comprise a polymeric matrix of polymer material in which is contained:
      one or more imaging agents comprising a light activated dye;
      a photo-oxidizing agent which is activated at a first wavelength of light to cause the one or more image-forming agents to form one or more images in or on the substrate; and
      a reducing agent which is activated at a second wavelength of light to cause termination of the formation of the one or more images; and (c) treating at least one of the first and second surfaces of the substrate of step (a) with the particulates of step (b).

2. The process of claim 1, wherein the substrate of step (a) comprises a paper web and wherein step (b) is carried out with a metering size press to treat at least one surface of the paper web with the particulates of step (b).

3. The process of claim 1, wherein the polymer material of each particulate of step (b) comprises cellulose acetate butyrate.

4. The process of claim 1, wherein the one or more imaging agents of step (b) comprise a leuco dye.

5. The process of claim 1, wherein each particulate of step (b) further contains one or more acids/couplers.

6. The process of claim 1, wherein the photo-oxidizing agent of step (b) is activated at a wavelength in the range of from about 300 to about 350 nm, and wherein the reducing agent of step (b) is activated at a wavelength in the range of from about 360 to about 450 nm.

7. A process for making a dual wavelength imaging composition comprising the following steps:
(a) providing a solvent; and
(b) dispersing a plurality of dual wavelength image-forming particulates in the solvent to form a dual wavelength imaging composition, wherein each particulate of the plurality of particulates comprises a polymeric matrix of polymer material in which is contained:
one or more image-forming agents comprising a light activated dye; a photo-oxidizing agent which is activated at a first wavelength of light to cause the one or more image-forming agents to form one or more images; and
a reducing agent which is activated at a second wavelength of light to cause termination of the formation of the one or more images.

8. The process of claim 7, wherein the solvent of step (a) comprises water.

9. The process of claim 7, wherein the polymer material of each particulate of step (b) comprises cellulose acetate butyrate.

10. The process of claim 7, wherein the polymer material comprises from about 40 to about 99% of the solids portion of the imaging composition of step (b).

11. The process of claim 7, wherein the one or more imaging agents of step (b) comprise a leuco dye comprising from about 0.1 to about 10% of the solids portion of the imaging composition.

12. The process of claim 7, wherein at least some of the particulates of step (b) are about 10 microns or less in diameter.

13. The process of claim 12, wherein at least some of the particulates of step (b) are about 5 microns or less in diameter.

14. The process of claim 7, wherein the particulates of step (b) are formed by the steps of: (c) coarsely grinding solid polymer material to form coarsely ground particulates; and (d) cryogenically grinding the coarsely ground particulates.

15. A process for making a dual wavelength imaging composition comprising the following steps:
(a) providing a solvent; and
(b) dispersing a plurality of dual wavelength image-forming particulates in the solvent to form a dual wavelength imaging composition, wherein each particulate of the plurality of particulates comprises a matrix of polymer material and contains:
one or more image-forming agents; a photo-oxidizing agent which is activated at a first wavelength of light to cause the one or more image-forming agents to form one or more images; and
a reducing agent which is activated at a second wavelength of light to cause termination of the formation of the one or more images;
wherein the particulates of step (b) are formed by the steps of: (c) coarsely grinding solid polymer material to form coarsely ground particulates; (d) dispersing the coarsely ground particulates in starch in water mixture to form a slurry; and (e) wet slurry grinding the dispersed particulates to provide the particulates of step (b).

* * * * *